US006692648B2

(12) United States Patent
Hwang et al.

(10) Patent No.: US 6,692,648 B2
(45) Date of Patent: *Feb. 17, 2004

(54) METHOD OF PLASMA HEATING AND ETCHING A SUBSTRATE

(75) Inventors: Jeng H. Hwang, Cupertino, CA (US); Xiaoyi Chen, Redwood City, CA (US)

(73) Assignee: Applied Materials Inc., Santa Clara, CA (US)

( * ) Notice: Subject to any disclaimer, the term of this patent is extended or adjusted under 35 U.S.C. 154(b) by 139 days.

This patent is subject to a terminal disclaimer.

(21) Appl. No.: 09/747,652

(22) Filed: Dec. 22, 2000

(65) Prior Publication Data

US 2002/0117471 A1 Aug. 29, 2002

(51) Int. Cl.$^7$ ............... H01L 21/302; C03C 25/68; B44C 1/22
(52) U.S. Cl. ............... 216/55; 216/67; 216/75; 438/706; 438/715; 438/720
(58) Field of Search ............... 216/55, 67, 75; 438/706, 715, 720

(56) References Cited

U.S. PATENT DOCUMENTS

| 4,213,818 | A | * | 7/1980 | Lemons et al. ............ 204/164 |
| 5,186,718 | A | | 2/1993 | Tepman et al. ............ 29/25.01 |
| 5,254,217 | A | * | 10/1993 | Maniar et al. ............ 438/585 |
| 5,789,320 | A | | 8/1998 | Andricacos et al. ........ 438/678 |
| 6,030,666 | A | | 2/2000 | Lam et al. ............... 427/539 |
| 6,046,116 | A | | 4/2000 | De Ornellas et al. ....... 438/715 |
| 6,087,265 | A | | 7/2000 | Hwang ................... 438/706 |
| 6,261,967 | B1 | * | 7/2001 | Athavale et al. .......... 438/240 |
| 6,323,132 | B1 | * | 11/2001 | Hwang et al. ............ 438/706 |
| 6,350,699 | B1 | * | 2/2002 | Maa et al. ............... 216/67 |
| 6,547,978 | B2 | * | 4/2003 | Ye et al. ................ 216/75 |
| 2001/0053610 | A1 | * | 12/2001 | Athavale et al. .......... 438/710 |

FOREIGN PATENT DOCUMENTS

| DE | 142966 | 7/1980 | ............ C23C/15/00 |
| DE | 285224 | 12/1990 | ......... H01L/21/265 |
| JP | 53109475 | 9/1978 | ......... H01L/21/203 |
| JP | 1088345 | 4/1998 | ............ C23C/14/50 |

OTHER PUBLICATIONS

Chow, T.P. and A. J. Steckl*. "Plasma Etching of Refractory Gates for VLSI Applications." *J. Electrochem. Soc.* (vol. 131, No. 10). Oct. 1984. pp. 2325–2335.

Chung, C.W. and H.G. Song*. "Study on Fence–Free Platinum Etching Using Chlorine–Based Gases in Inductively Coupled Plasma." *J. Electrochem. Soc.* (vol. 144, No. 11). Nov. 1997. pp. L294–L296.

Ye, Yan**. "0.35–Micron and Sub–0.35–Micron Metal Stack Etch in a DPS Chamber–DPS Chamber and Process Characterization." *Electrochem. Soc. Proc.* (vol. 96–12). 1996. pp. 222–233.

* cited by examiner

*Primary Examiner*—Nadine G. Norton
*Assistant Examiner*—Shamim Ahmed
(74) *Attorney, Agent, or Firm*—Shirley Church; Joseph Bach

(57) ABSTRACT

We have discovered a method of reducing the effect of material sputtered/etched during the preheating of a substrate. One embodiment of the method pertains to the preheating of a substrate which includes a material which is to be pattern etched at a temperature in excess of 150° C. The method comprises exposing the substrate to a preheating plasma generated from a plasma source gas which includes a reactive gas that aids in the production of a sputtered/etched residue during the preheating which is more easily etched during a subsequent pattern etching step than the material which is being pattern etched. In another embodiment of the method, the reactive gas in the preheating plasma source gas is slightly reactive with the material which is to etched during the subsequent pattern etching step.

25 Claims, 6 Drawing Sheets

METHOD OF PLASMA HEATING AND ETCHING A SUBSTRATE

BACKGROUND OF THE INVENTION

1. Field of the Invention

The present invention pertains to a method of plasma heating a substrate and then etching the substrate, where deposits generated during plasma heating are removed so that control over a critical dimension of an etched feature is maintained.

2. Brief Description of the Background Art

Maintaining a substrate at a particular temperature during semiconductor processing frequently enables control of the critical dimension of a feature on the substrate. Processing may involve chemical vapor deposition (CVD), physical vapor deposition (PVD), or plasma etching, for example.

In a plasma etching process, a substrate is typically placed on an electrostatic chuck in an etch reactor in which the substrate is exposed to an etchant plasma. The temperature of the substrate may be controlled using a gas in contact with the backside of the substrate. When the gas in contact with the substrate is at a lower temperature than the substrate, so that it acts as a coolant, the substrate may be allowed to heat by a reduction of the pressure of the coolant gas. Specifically, when the pressure of the gas in contact with the backside of the substrate is reduced, the rate of heat removal is decreased, and thus the temperature of the substrate is increased.

Other methods for heating a substrate to a desired temperature include use of a resistive heating element embedded in the electrostatic chuck. The heated chuck may be used in combination with a coolant gas to adjust the substrate temperature.

One method for heating a substrate surface involves the use of ion bombardment of the substrate surface during semiconductor processing. RF coupled or microwave energy may be used to produce a plasma which is the source of ions which come in contact with the substrate. A biasing power may be applied to the substrate to attract ions toward the substrate, to provide a more rapid heating of the substrate. However, use of a substrate bias to attract ions toward the substrate generally causes sputtering of more malleable materials on the substrate surface, such as metals. Thus, when a metal layer is being etched, for example, a portion of the metal layer is typically sputtered up onto the sidewalls of an overlying patterned mask which is used to provide patterned etching of the metal layer. Subsequent removal of the sputtered material has proven difficult. In an attempt to reduce or avoid sputtering of surface materials during plasma heating of a substrate surface, various gases have been used as the plasma source gas, to lessen the sputtering effect. Specifically, it has been recommended that the gas used to form the plasma be composed of one or more gases including, for example, oxygen, argon, silane, silicon tetrafluoride, helium, neon, krypton, xenon, nitrogen, or mixtures thereof. Nitrogen gas is said to produce less satisfactory results, with the material being heated possibly forming nitrides, similar to the manner in which oxides are produced when an oxygen plasma is used.

In some instances, it has been recommended that no substrate biasing be used, and that a lower heating rate be accepted. The use of a substrate heating plasma generated using only microwave energy is said to reduce the amount of sputtering of a substrate surface. For instance, when an RF bias is applied to a substrate having a $SiO_2$ surface, the sputter rate of the $SiO_2$ is said to be on the order of 1000 Å per minute, but when no substrate bias is applied, and the only energy applied is microwave energy used to produce the plasma, the sputter rate is said to be reduced well over 50%.

Substrate temperature control is an important factor in the control of critical dimensions of a feature during plasma etching of the feature. For instance, during etch processing, the materials from a portion of the layer that is etched, as well as compounds formed by a combination of the etchant gases and the layer materials, may coat the sides of the patterned mask overlying the feature which is being etched, or may coat the sides of the feature being etched and thereby reduce the size of the opening through which etching occurs. This may result in an increase in the size of the feature produced during etching and may result in an etch profile which is different from the top to the bottom of the etched feature. Such growth of a feature dimension and variation in feature sidewall profile may be critical and may detrimentally affect the functionality of the features. By increasing the temperature of the substrate during processing, etch byproducts remain more volatile, and control over etch sidewall profile, as well as growth of critical feature dimensions, may be achieved.

High substrate temperature etching is advantageous when the materials being etched are either metal or metal-containing compounds which are of low volatility, such as, for example, platinum, copper, iridium, iridium dioxide, lead zirconium titanate, ruthenium, ruthenium dioxide, barium strontium titanate, and bismuth strontium tantalate.

In summary, although it is possible to reduce sputtering during plasma heating of substrates by reducing substrate biasing, this substantially slows the heating process. The use of resistance heaters in the electrostatic chuck under the substrate is expensive and decreases the response time when it is desired to stop heating or to cool the substrate. Accordingly, there remains a need for a substrate heating method that provides rapid substrate heating while reducing the effect of material sputtered during the heating process on the critical dimension and sidewall profile of an etched feature.

SUMMARY OF THE INVENTION

We have discovered a method of reducing the effect of material sputtered/etched during the heating of a substrate.

One embodiment of the method pertains to the preheating of a substrate which includes a material which is to be pattern etched at a temperature in excess of 150° C. The method comprises exposing the substrate to a preheating plasma generated from a plasma source gas which includes a reactive gas that aids in the production of a sputtered/etched residue during the preheating which is more easily etched during a subsequent pattern etching step than the material which is being pattern etched. In another embodiment of the method, the reactive gas in the preheating plasma source gas is slightly reactive with the material which is to etched during the subsequent pattern etching step.

In another embodiment, plasma heating of a substrate and subsequent etching of a metal-containing layer included in said substrate is carried out while maintaining control over a critical dimension of a feature etched in the metal-containing layer. In particular, the method includes:

a) supplying a first plasma source gas to a process chamber containing a substrate, wherein the first plasma source gas is used to generate a plasma which is used to preheat the said substrate, and wherein the plasma source gas contains at least one gas which is slightly reactive with the metal-containing layer;

b) preheating the substrate to a temperature of at least 150° C. using ion bombardment from the first plasma;

c) supplying a second plasma source gas which generates a plasma used to etch the metal-containing layer; and d) etching the metal-containing layer, wherein essentially all of a residue generated during the preheating of the substrate is removed during the etching of the metal-containing layer.

DETAILED DESCRIPTION OF THE PREFERRED EMBODIMENTS

Figure 1A:
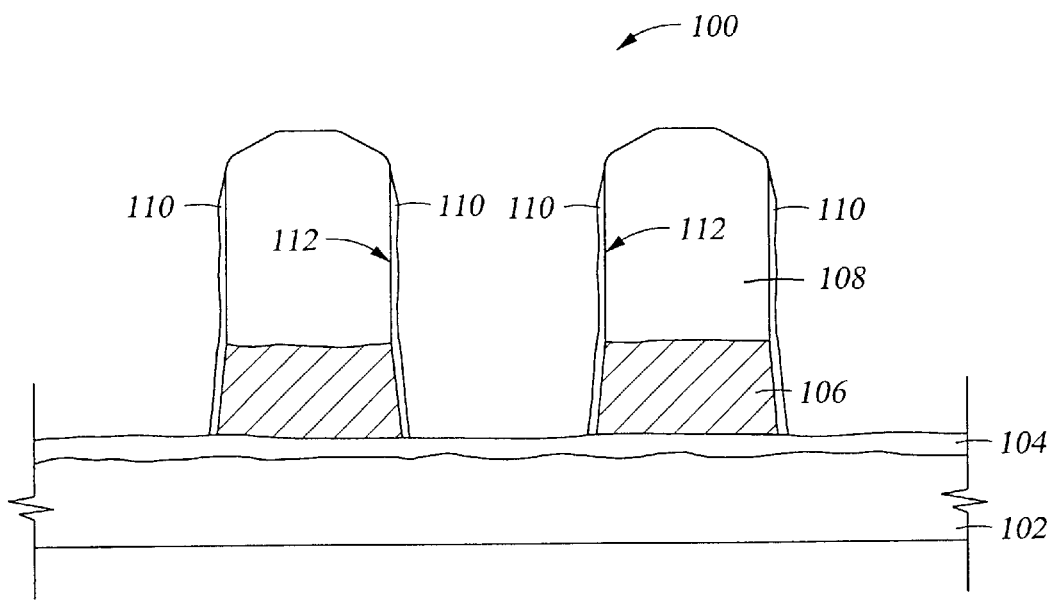
FIG. 1A shows an etched stack of layers (100) including a patterned hard mask layer (108) overlying a platinum-containing layer (106), which overlies a titanium nitride layer (104), which overlies a silicon oxide layer (102). Residue material (110) produced by sputtering during preheating of the substrate and during patterned etching of the stack of the layers (100) resides on the sidewalls (112).

Described in detail below is a method of reducing the effect on etched feature critical dimensions of material sputtered during the heating of a substrate. As a preface to the detailed description, it should be noted that, as used in this specification and the appended claims, the singular forms "a", "an", and "the" include plural referents, unless the context clearly dictates otherwise.

We have discovered a method of reducing the effect of material sputtered/etched during the heating of a substrate. This permits the use of ion bombardment to heat substrates despite the fact that the ion bombardment may sputter/etch features on the substrate causing deposits and residue to form on features within the substrate.

It is crucial in the production of submicron-sized devices that critical dimensions be maintained during the etching of a semiconductor feature. When the feature to be etched requires high temperature etch conditions, it is necessary to preheat the substrate before beginning the feature etching, so that etch by-products are sufficiently volatile. Ion bombardment heating of a substrate which leads to sputtering/etching of an exposed layer which is to be etched is possible without affecting the critical dimension of the etched feature if the plasma source gas used for heating enables the subsequent removal of substantially all of the sputtered/etched material generated during the preheating step. The sputtered/etched residue from preheating is removed during the etch step which follows the preheating of a substrate, for example.

To enable removal of a preheating sputtered/etched material residue, the plasma source gas used to generate the preheating plasma may provide a plasma which is slightly reactive with at least the exposed layer which is to be subsequently etched. Frequently the exposed layer is a metal. For example, and not by way of limitation, in the etching of platinum-comprising material, iridium-comprising material, and ruthenium-comprising material, the preheating plasma is slightly reactive with the metal-comprising material.

It may also be advantageous to have the preheating plasma source gas contain a gas which is slightly reactive with the patterned masking material which overlies the layer exposed for etching. This is the case when the masking material is capable of providing reactive species which react with the material sputtered/etched from the exposed layer during the preheating step.

No single plasma source gas combination will produce the desired etch results on all substrates. Thus, for a given material layer to be pattern etched, one skilled in the art should select a combination of plasma source gases for the etch step which will provide an acceptable etch rate and etch selectivity with respect to substrate materials adjacent to the material which is being pattern etched, and meet other required etch criteria. Once the combination of gases to be used during the patterning etch step has been determined, the particular plasma source gas to be used during preheating of the substrate is selected. The plasma source gas for substrate preheating may be a single gas or a combination of gases, but needs to include at least one gas which is at least slightly reactive with the substrate material to be etched. Preferably, the plasma source gas for generation of the substrate preheating plasma contains at least one gas from the combination of etchant plasma gases used in the subsequent etching of the substrate material, as this simplifies processing requirements.

This inventive method provides a relatively quick way of heating a substrate without using a resistance heater in an electrostatic chuck, thereby avoiding the added cost of such equipment and the undesired effects when needing to cool the substrate. Further, this inventive method is not focused on eliminating the sputtering of material during a substrate preheating step, but rather is focused on removing the material that is sputtered during the preheating step during the patterned etching step.

I. AN APPARATUS FOR PRACTICING THE INVENTION

The embodiment etch processes described herein were carried out in a CENTURA® Integrated Processing System, available from Applied Materials, Inc., of Santa Clara, Calif. The system is shown and described in U.S. Pat. No. 5,186,718, the disclosure of which is hereby incorporated by reference. Although the etch process chamber used in the Examples presented herein is shown in schematic in FIG. 6, any of the etch processors available in the industry should be able to take advantage of the etch chemistry described herein, with some adjustment to other process parameters. The equipment shown in schematic in FIG. 6 includes a Decoupled Plasma Source (DPS) of the kind described by Yan Ye et al. at the Proceedings of the Eleventh International Symposium of Plasma Processing (May 7, 1996) and published in the *Electrochemical Society Proceedings* (Volume 96–12, pp. 222–233, 1996), which is hereby incorporated by reference. The plasma processing chamber enables the processing of an 8 inch (200 mm) diameter wafer.

Figure 6:
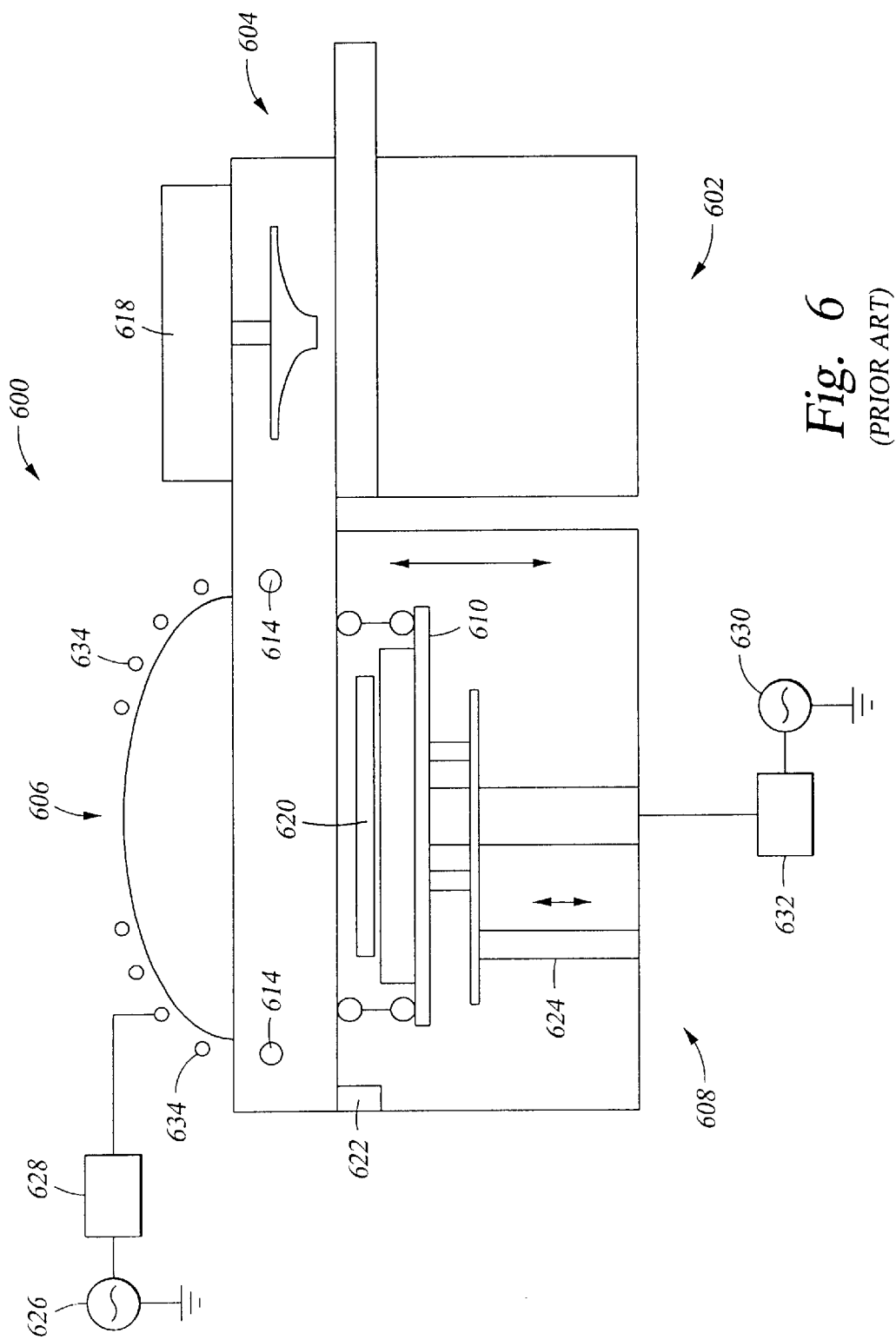
FIG. 6 shows an example of an apparatus which can be used to carry out the etching processes described herein.

FIG. 6 shows a schematic of a side view of an individual CENTURA® DPS™ metal etch chamber 600. The etch chamber 600 consists of an upper chamber 604 having a ceramic dome 606, and a lower chamber 608. The lower chamber 608 includes a monopolar electrostatic chuck (ESC) cathode 610. Gas is introduced into the chamber via gas injection nozzles 614 for uniform gas distribution. Chamber pressure is controlled by a closed-loop pressure control system (not shown) using a throttle valve 618. During processing, a substrate 620 is introduced into the lower chamber 608 through inlet 622. The substrate 620 is held in place by means of a static charge generated on the surface of electrostatic chuck (ESC) cathode 610 by applying a DC voltage to a conductive layer (not shown) located under a dielectric film (not shown) on the chuck surface. The cathode 610 and substrate 620 are then raised by means of a wafer lift 624 and sealed against the upper chamber 604 in position for processing. Etch gases are introduced into the upper chamber 604 via gas injection nozzles 614. The etch chamber 600 uses an inductively coupled plasma source power 626 and matching network 628 operating at about 2.0 MHZ for generating and sustaining a high density plasma. The wafer is biased with an RF source 630 and matching network 632 operating at about 13.56 MHZ. Plasma source power 626 and substrate biasing means 630 are controlled by separate controllers (not shown).

II. THE METHOD OF THE INVENTION FOR PLASMA HEATING AND ETCHING A SUBSTRATE WHILE MAINTAINING CRITICAL DIMENSION

The present invention pertains to a method of reducing the effect on etched feature critical dimensions and etched sidewall profile, which results from the presence of residue produced during an ion-bombardment heating of the substrate in which the feature resides. The sputtered material from the preheating step is removed during the subsequent etching of the substrate.

A patterned hard mask layer may be used in plasma etching to cover portions of the underlying substrate layer, while leaving other portions of the layer exposed to an etchant plasma. A hard masking layer is typically used for patterned etching of underlying layers when the layer to be etched is one which requires high temperature etching to obtain a reasonable etch rate or selectivity, or where the etch by-products are non-volatile and require a higher temperature substrate to reduce the amount of by-product which remains on the etched surfaces after completion of the etch process. Many of the metal layers deposited to form conductive structures require the use of a patterned hard mask layer rather than a photoresist, due to the substrate temperature required to produce the desired etch results. Examples, not by way of limitation, of metals or metal-containing compounds which require a high temperature substrate during etching include platinum, iridium, iridium dioxide, ruthenium, and ruthenium dioxide. Typically these metals are used in the formation of capacitor electrodes, gate electrodes, contacts, and other conductive structures.

During the development of the present method, we performed numerous experiments to determine the typical amount of material sputtered onto the vertical sidewalls of a patterned hard masking layer during a substrate (etch stack) preheating step. Table One, below, shows various examples of plasma source gases used to produce the preheating plasma, and a description of the appearance of the sidewall profile of the patterned hard mask after completion of the preheating step. The etch stack was as previously described with reference to FIG. 1, where the patterned hard mask layer is a bi-layer, as described in detail below.

TABLE ONE

Preheated Platinum-Containing Substrate - Hard Mask Sidewall Profile

| Run # | 1 | 2 | 3 | 4 | 5 |
|---|---|---|---|---|---|
| $N_2$ Preheat Gas (sccm) | 50 | — | 100 | — | 15 |
| $O_2$ Preheat Gas (sccm) | — | — | — | 100 | — |
| Ar Preheat Gas (sccm) | 50 | 100 | — | — | 30 |
| $Cl_2$ Preheat Gas (sccm) | — | — | — | — | 120 |
| Hardmask Sidewall Profile | Essentially Vertical (Light Build-up) | Slightly Tapered (Moderate Build-up) | Essentially Vertical (Light Build-up) | Essentially Vertical (Light Build-up) | Very Tapered (Heavy Build-up) |

Each substrate was preheated for about 45 seconds. Other preheating parameters included a process chamber pressure of about 20 mTorr; an RF substrate bias power of about 500

W; an RF plasma source power of about 1800 W; and a cathode temperature of about 80° C.

With reference to FIG. 1, from bottom to top of the etch stack, the bottom layer of silicon oxide ($SiO_x$) 102 was about 8000 Å thick, the overlying barrier layer of titanium nitride (TiN) 104 was about 200 Å thick, the platinum (Pt)-comprising layer 106 was about 2500 Å thick, and the patterned hard mask layer 108 was a bi-layer (not shown as a bilayer in FIG. 1), where the bottom layer was about 300 Å of TiN, and the top, overlying layer was about 5000 Å of TEOS produced silicon oxide ($SiO_x$). The underlying metal layer was platinum.

The term "hardmask sidewall profile", as used in Table One, refers to the cross-sectional profile of the hard mask and to the angle of the patterned mask sidewall after a substrate preheating step, relative to an underlying horizontal substrate. When large amounts of material sputter during plasma preheating of the etch stack (substrate), such sputtered material tends to build-up at the base of the patterned hard mask, forming a wedge-shaped hard mask sidewall. This wedge shape tends to continue downward during etching of an underlying metal layer, affecting the sidewall profile of the etched metal layer and the critical dimensions of the etched metal features. With reference to Table One, the hard mask profiles were studied after a preheat step and prior to etching of an underlying metal layer in order to evaluate the amount of material deposited on the vertical sidewall of the patterned hard mask during the preheating step, when different plasma source gases were used during the preheating step.

The best hard mask sidewall profiles were obtained in Runs #1, #3, and #4. When the plasma source gas during substrate preheating was made up from a mixture of nitrogen and argon gas, with a high (50%) concentration of nitrogen, or was nitrogen, or oxygen, respectively, the hard mask profile was essentially vertical, indicating only a light build-up of sputtered material. However, when argon gas, or a combination of nitrogen, argon, and chlorine gas, represented by Runs #2 and #5, respectively, was used as the plasma source gas for generation of the plasma used to preheat the substrate, the profile was significantly tapered. Thus, a wedge-like vertical layer of sputtered material was deposited on the hard mask sidewall. In Run #2, the plasma source gas used during substrate preheating was essentially non-reactive with both the exposed platinum layer and with the overlying silicon oxide hard masking material. In Run #5, nearly 73% of the plasma source gas used during substrate preheating was $Cl_2$, which is highly reactive with the exposed platinum layer and which is moderately reactive with the overlying silicon oxide hard masking material.

Experiments were then performed to determine the final etch profile for etch stacks in which the etch stack (substrate) was preheated using a plasma generated from one plasma source gas, and the platinum-containing layer was pattern etched using a plasma generated from another plasma source gas. The results of these experiments are presented in Table Two, below.

TABLE TWO

| Preheated and Plasma-Etched Platinum-Containing Layer-Etch Profile | | | |
|---|---|---|---|
| Run # | 1 | 2 | 3 |
| $N_2$ Preheat Gas (sccm) | 100 | — | — |
| $O_2$ Preheat Gas (sccm) | — | 50 | 100 |
| Ar Preheat Gas (sccm) | — | 50 | — |
| $Cl_2$, Pt Etch Gas (sccm) | 120 | 120 | 120 |
| $N_2$ Pt Etch Gas (sccm) | 15 | 15 | 15 |

TABLE TWO-continued

| Preheated and Plasma-Etched Platinum-Containing Layer-Etch Profile | | | |
|---|---|---|---|
| Run # | 1 | 2 | 3 |
| Ar, Pt Etch Gas (sccm) | 30 | 30 | 30 |
| Etch Profile | Essentially Vertical | Tapered | Tapered |

Each substrate was preheated for about 45 seconds. Further preheating parameters include a chamber pressure of about 20 mTorr; a substrate bias power of about 500 W; a plasma source power of about 1800 W; and a cathode temperature of about 80° C. The etch stack was the same as that described above with reference to Table One.

Patterned etching of the platinum layer was carried out until the platinum etch completion was detected by an optical endpoint detector, then an overetch was carried out for an additional 30 seconds. The pressure in the etch chamber was about 20 mTorr; the substrate bias power applied was about 275 W; the plasma source power was about 900 W; and the cathode (substrate pedestal) temperature was about 80° C. As previously mentioned, the platinum-containing layer had a thickness of about 2500 Å.

The best etch profile was obtained in Run #1. Only nitrogen gas was used as the plasma source gas during preheating of the substrate; nitrogen gas was also contained in the source gas used for generating the platinum etchant plasma. Virtually no residue remained on the hard mask at the completion of etching, and a vertical etch profile was obtained. However, when a combination of oxygen and argon gas was used as the plasma source gas during preheating of the substrate (Run #2), residue did remain on the surfaces of the hard mask and etched platinum feature at the completion of the platinum etching. A tapered profile was observed. When only oxygen gas was used as the plasma source gas during preheating of the substrate (Run #3), a similar, but slightly thicker residue was observed on the hard mask and etched platinum features. Again, a tapered profile was observed.

Applicants used the etch plasma source gas and etch process conditions described in Table Two to etch the platinum layer in the same etch stack, where the substrate was not preheated using plasma heating, but was heated using a "hot" electrostatic chuck (heated by an embedded resistive heater). No residue was observed on the hard mask surfaces, nor on the etched platinum surfaces. This indicates that the residue in Run #2 or Run #3 occurs when sputtered platinum-containing material generated during a plasma preheating step is not removed during the subsequent etching of the platinum layer.

Applicants concluded, based on the above experimentation, that once a satisfactory plasma source gas is developed for etching a metal layer such as platinum, the plasma source gas used for plasma preheating of the substrate may advantageously contain a gas which is used in etching the metal layer. However, the preheating plasma overall reactivity with the metal layer material must be controlled. If the reactivity is insufficient, built up residue from the preheating step may be so difficult to remove that it remains during the metal etch step, to cause problems with etch profile. If the reactivity is too great, the amount of built up residue present after the preheating step may be such a large quantity that it cannot be adequately removed during the metal etch step, again causing problems with the etch profile. As used herein, a "lightly reactive" or "slightly reactive" plasma refers to a plasma which provides sufficient reactivity with the exposed layer to be etched (one of the metals described above, for example) that the sputter/etch byproduct produced during preheating of the substrate is more easily etched than the pure exposed layer (metal) during the subsequent etch of the exposed layer.

For example, and not by way of limitation, in the etching of platinum, the slightly reactive plasma to be used in a substrate preheating step should be capable of etching a pure platinum layer at an etch rate of at least about 200 Å per minute. For example, if nitrogen alone was used to plasma etch a platinum layer, a maximum platinum etch rate of about 290 Å per minute would be expected. One skilled in the art, after reading applicants' disclosure will understand that it is important to use a plasma source gas (which may be a combination of gases) which generates a preheating plasma which is slightly reactive with the exposed layer to be etched. As previously mentioned herein, the preheating plasma may also be slightly reactive with an overlying hardmasking layer, if the hardmasking material will produce reactive species which react with the material sputtered from the exposed layer during the preheating step, thereby generating a sputtered/etched residue which is more easily removed during the subsequent etch step.

Although the hard masking material described herein with reference to the etching of platinum is silicon oxide, it is not applicants' intent to be limited to this hard masking material, as other metal containing hard masking materials such as TiN, SiN, $TiO_2$, or high temperature organic masking materials such as "α-C" polymers (high temperature amorphous carbon-comprising materials) and "α-FC" polymers (high temperature fluorocarbon materials) and FLARE™ (a polyarylene ether, available from Allied Signal, Advanced Microelectronic Materials, Sunnyvale, Calif.) are also contemplated.

In the above examples, minimum residue after platinum etching was observed when nitrogen was present in both the plasma source gas used during substrate preheating and the plasma source gas used during platinum etching. One might then believe that chlorine could be used in the plasma source gas for preheating of the substrate; however, the data show that when chlorine is used, at least in a substantial amount, during substrate preheating, large amounts of residue are produced on the hard mask sidewalls. These large amounts of residue distort the hard mask sidewall surfaces (the mask sidewall profile), so that the openings through which the metal can be etched do not enable etching of the metal layer to the desired critical dimensions (even if it were possible to gradually remove the residue during etching of the metal layer). This indicates that when the plasma used for preheating the substrate is highly reactive with the metal layer, this does not provide a good overall result in terms of the etched feature. Thus, the use of chlorine as the major component of a preheating plasma source gas is not advisable. However, the presence of small amounts of highly reactive gases in a source gas, so that the plasma itself is only slightly reactive with the exposed layer to be etched may be acceptable. As used herein, the term "highly reactive" plasma, with respect to the etching of platinum is a plasma which produces a platinum etch rate in excess of about 800 Å per minute. For example, if a plasma generated from a solely chlorine source gas was used to plasma etch a platinum layer, a platinum etch rate of at least about 800 Å per minute would be expected, using the other process conditions and the process apparatus described above.

In view of the data obtained for platinum, the preheating plasma should be capable of etching the material which is to be pattern etched at an etch rate ranging between about 200 Å per minute and about 800 Å per minute, preferably at an etch rate ranging between about 250 Å per minute and about 600 Å per minute. One skilled in the art will be able to adjust the plasma source gas compositions and overall process conditions in their particular apparatus to achieve a desired result for a given material to be pattern etched in view of the disclosure provided herein.

When a non-reactive gas, typically an inert gas such as helium, argon, krypton, or xenon, is used as the sole plasma source gas for substrate preheating, moderate amounts of residue remained after the subsequent metal etch. When a combination of a non-reactive gas and a lightly reactive gas (argon/nitrogen) was used as the plasma source gas for substrate preheating, light to moderate amounts of residue remained after the subsequent metal etch. The best results were obtained when the lightly reactive gas (nitrogen) was used as the sole plasma source gas for substrate preheating. However, the preheating plasma source gas may contain a limited amount of a gas which is essentially non-reactive, as a diluent within the plasma source gas. A minor amount of experimentation would be required to determine how much diluent gas can be used and still provide a sputtered/etched residue which is more easily removed during the etch step than a pure residue of the exposed material which is to be etched during the etch step.

The principles discussed above are best illustrated with reference to the Figures provided herein. FIG. 1A shows the etch profile obtained for an etch stack (a substrate) including, from top to bottom, the bi-layer patterned hard mask 108 previously described, overlying a platinum-containing layer 106, which overlies a titanium nitride layer 104, which overlies a silicon oxide layer 102. Residue material 110 produced by sputtering during preheating of the substrate and during patterned etching of the stack of the layers 100 remains on the sidewalls 112. The substrate was preheated using a plasma generated solely from $O_2$. The platinum-containing layer 106 was etched using the $Cl_2/N_2/Ar$ plasma source described in Table Two. The process conditions were as described previously, above.

Figure 1B:
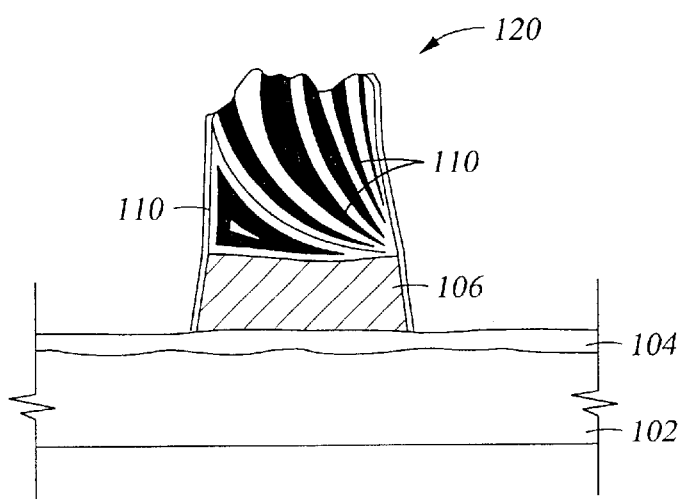
FIG. 1B shows the etched stack of layers of FIG. 1A after treatment with a diluted HF solution to remove patterned hard mask layer (108). The etched structure produced (120) includes platinum-containing layer (106) overlying titanium nitride layer (104), which overlies silicon oxide layer (102). Sputtered material (110) has collapsed upon itself after removal of residual silicon oxide hard mask layer (108).

FIG. 1B shows the substrate of FIG. 1A after being exposed to a diluted HF solution (typically about a 6:1 ratio of $H_2O:HF$). From FIG. 1B, one can see how the sputtered material 110 on the vertical sidewalls 112 of the patterned hard mask 108 collapsed on top of the etched platinum layer 106 once the hard mask was removed by the diluted HF solution.

Figure 2A:
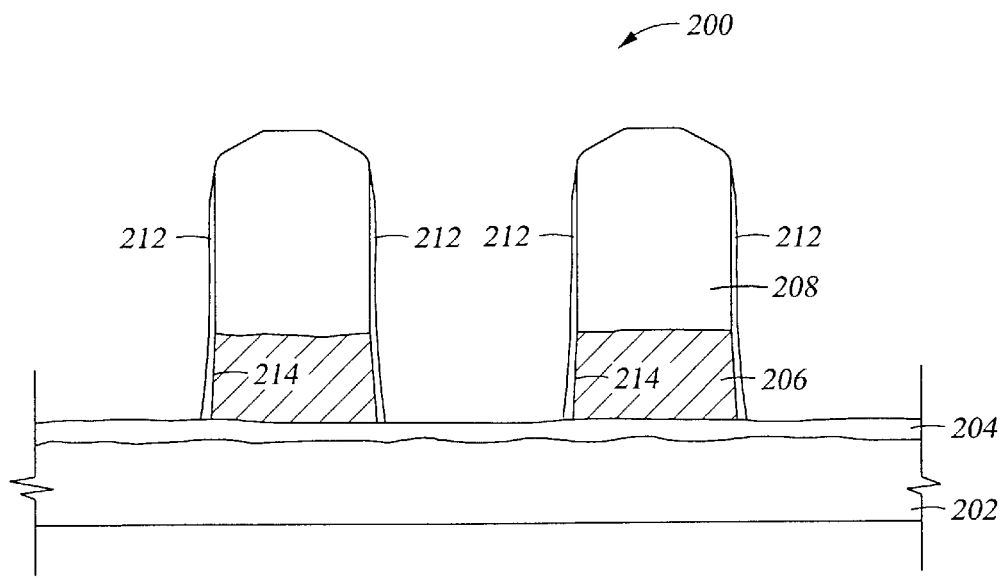
FIG. 2A shows an etched stack of layers (200) including a patterned silicon oxide hard mask layer (208) overlying a platinum-containing layer (206), which overlies a titanium nitride layer (204), which overlies a silicon oxide layer (202). No sputtered material remains on etched sidewalls (212) after patterned etching of the stack of the layers (200).

FIG. 2A shows the etch profile obtained for an etch stack (a substrate) including from top to bottom, the bi-layer patterned hard mask 208 previously described, overlying a platinum-containing layer 206, which overlies a titanium nitride layer 204, which overlies a silicon oxide layer 202. No residue material was observed on the sidewalls 212 of the hard mask 208, nor on the sidewalls 214 of the etched platinum-containing layer 206, after completion of etch of the platinum-containing layer 206. The substrate was preheated using a plasma generated solely from $N_2$, which produced a slight sputtered build-up, as indicated for Run #3 in Table One. The platinum-containing layer 206 was etched using the same $Cl_2/N_2/Ar$ etchant plasma described with reference to FIG. 1A. At the completion of etch of the platinum-containing layer 206, the slight build-up of sputtered material from the substrate preheating step had been removed.

Figure 2B:
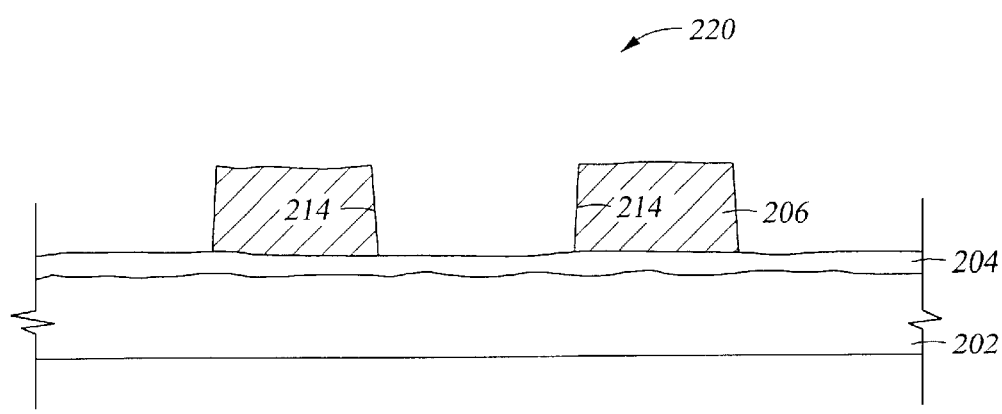
FIG. 2B shows the etched stack of layers of FIG. 2A after treatment with a diluted HF solution to remove patterned hard mask layer (208). The etched structure produced (220) includes platinum-containing layer (206) overlying titanium nitride layer (204), which overlies silicon oxide layer (202). There was no residual sputtered material on the sidewalls (212) of etched silicon oxide hard masking layer (208). There was no apparent residual sputtered material on the sidewalls (214) of the etched platinum layer (206).

FIG. 2B shows the substrate of FIG. 2A after exposure to a diluted HF solution. FIG. 2B clearly illustrates that virtually all of the sputtered material was removed during the platinum-containing layer plasma etch step.

Figure 3:
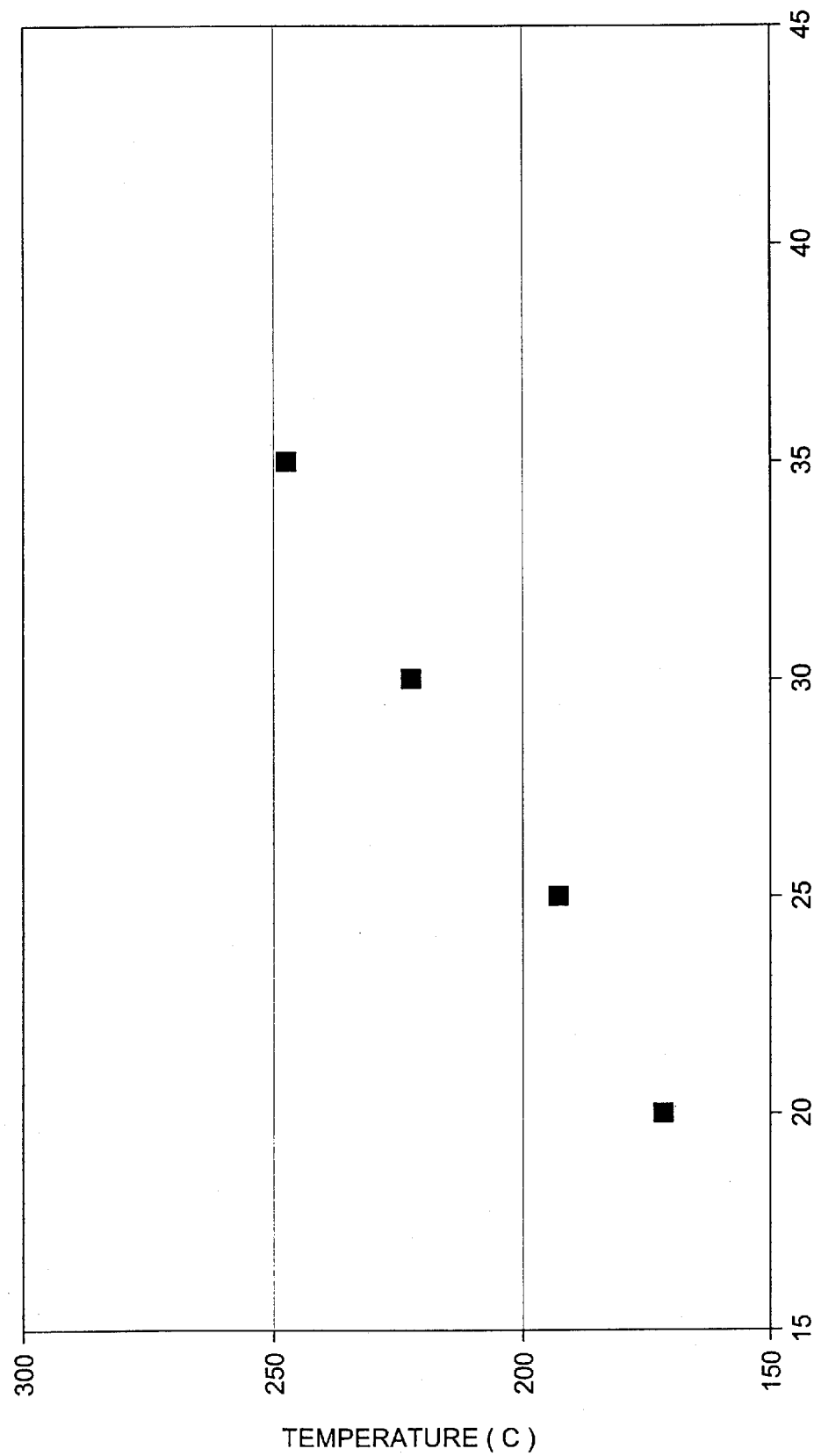
FIG. 3 shows the time-temperature correlation during a substrate preheating step, where the preheating plasma is formed from nitrogen gas and the substrate is a stack of layers of the kind described with reference to FIG. 1A, but prior to patterned etching.

FIG. 3 illustrates the heating rate for preheating of the etch stack described above when nitrogen alone is used as the plasma source gas for the preheating plasma. One skilled in the art will appreciate that this is a competitive heating rate for plasma preheating of a substrate.

Figure 4A:
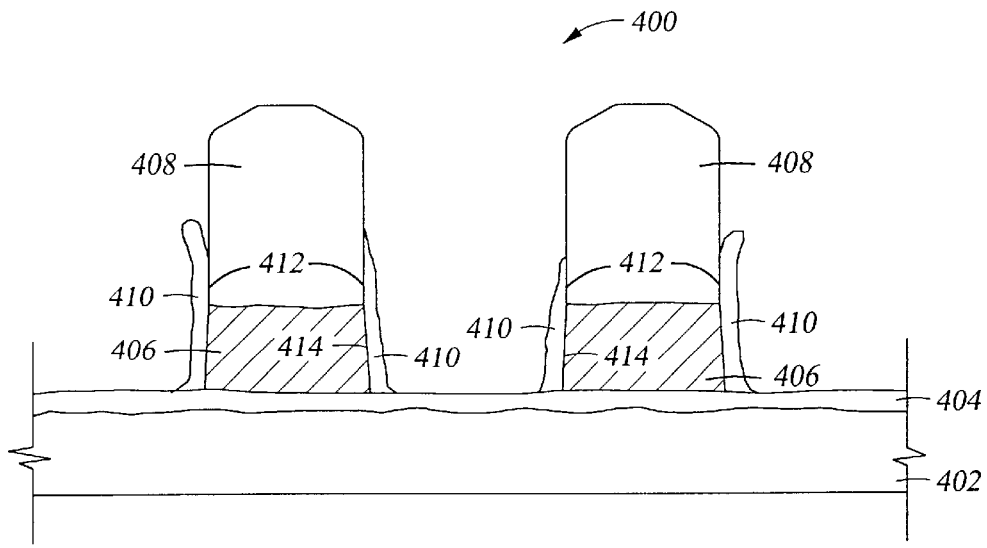
FIG. 4A shows an etched stack of layers (400) including a patterned silicon oxide hard mask layer (408) overlying a platinum-containing layer (406), which overlies a titanium nitride layer (404), which overlies a silicon oxide layer (402). Residue material (410) produced by sputtering during preheating of the substrate and during patterned etching of the stack of the layers (400) resides on the hard mask sidewalls (412), as well as on the sidewalls (414) of platinum-containing layer (406).

FIG. 4A shows the etch profile obtained for an etch stack (a substrate) including from top to bottom, the bi-layer patterned hard mask 408 previously described, overlying a platinum-containing layer 406, which overlies a titanium nitride layer 404, which overlies a silicon oxide layer 402. Residue material 410 produced by sputtering during preheating of the substrate, and during patterned etching of the stack of the layers 400 resides on the sidewalls 412 of hard mask 408 and on the sidewalls 414 of etched platinum-containing layer 406. The substrate was preheated using a plasma generated from 50 sccm of Ar and 50 sccm of $N_2$, and is referenced in Table One as Run #1. The platinum-containing layer 406 was etched using the $Cl_2/N_2/Ar$ plasma source described in Table Two. The process conditions were as described previously, above.

Figure 4B:
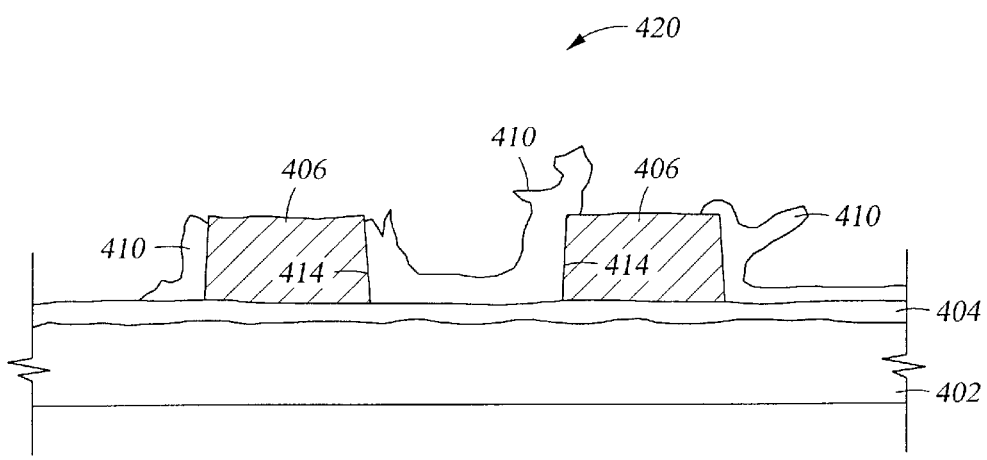
FIG. 4B shows the etched stack of layers of FIG. 4A after treatment with a diluted HF solution to remove patterned silicon oxide hard mask layer (408). The etched structure produced (420) includes platinum-containing layer (406) overlying titanium nitride layer (404), which overlies silicon oxide layer (402). Residue material (410) has collapsed toward the exterior of sidewalls (414).

FIG. 4B shows the substrate of FIG. 4A after exposure to a diluted HF solution. From FIG. 4B, one can see how the sputtered material 410 which was on the vertical sidewalls 412 of the patterned hard mask 408 collapsed about the exterior surfaces of etched platinum-containing layer 406 once the hard mask was removed.

Figure 5A:
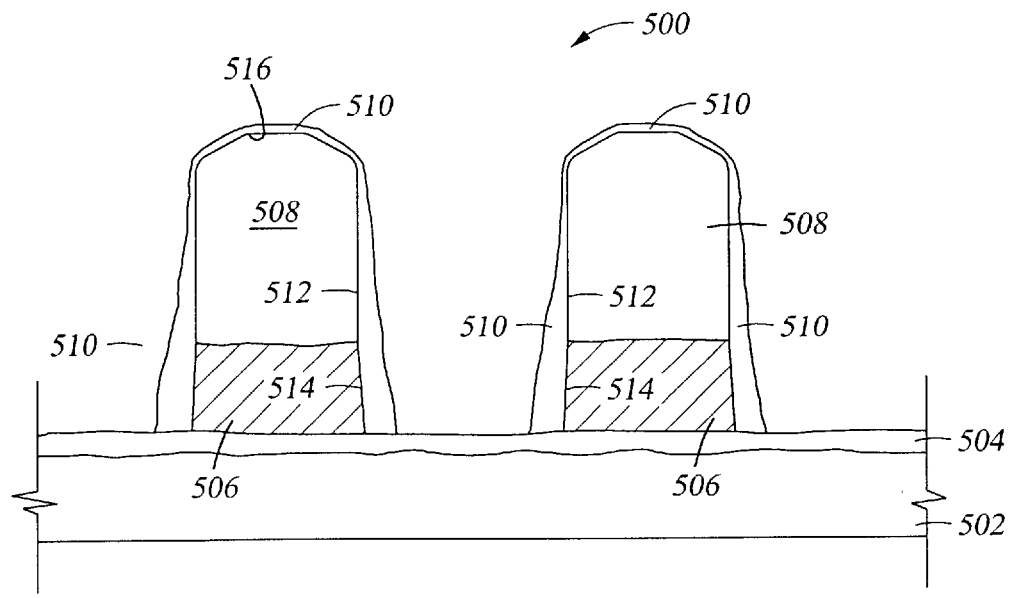
FIG. 5A shows an etched stack of layers (500) including a patterned silicon oxide hard mask layer (508) overlying a platinum-containing layer (506), which overlies a titanium nitride layer (504), which overlies a silicon oxide layer (502). Residue material (510) produced by sputtering during preheating of the substrate and during patterned etching of the stack of the layers (500) resides on the hard mask sidewalls (512), as well as on the sidewalls (514) of platinum-containing layer (506). There is so much residual material (510) that it even covers the upper surface (516) of hard mask layer (508).

FIG. 5A shows the etch profile obtained for an etch stack (a substrate) including, from top to bottom, the bi-layer patterned hard mask 508 previously described, overlying a platinum-containing layer 506, which overlies a titanium nitride layer 504, which overlies a silicon oxide layer 502. Residue material 510 produced during preheating of the substrate, and during patterned etching of the stack of the layers 500, resides in very large amounts on the sidewalls 512 of hard mask 508 and on the sidewalls 514 of etched platinum-containing layer 506. The substrate was preheated using a plasma generated from 120 sccm of $Cl_2$, 30 sccm of Ar, and 15 sccm of $N_2$, and is referenced in Table One as Run #5. The platinum-containing layer 506 was etched using the $Cl_2/N_2/Ar$ plasma source described in Table Two. The process conditions were as described previously, above.

Figure 5B:
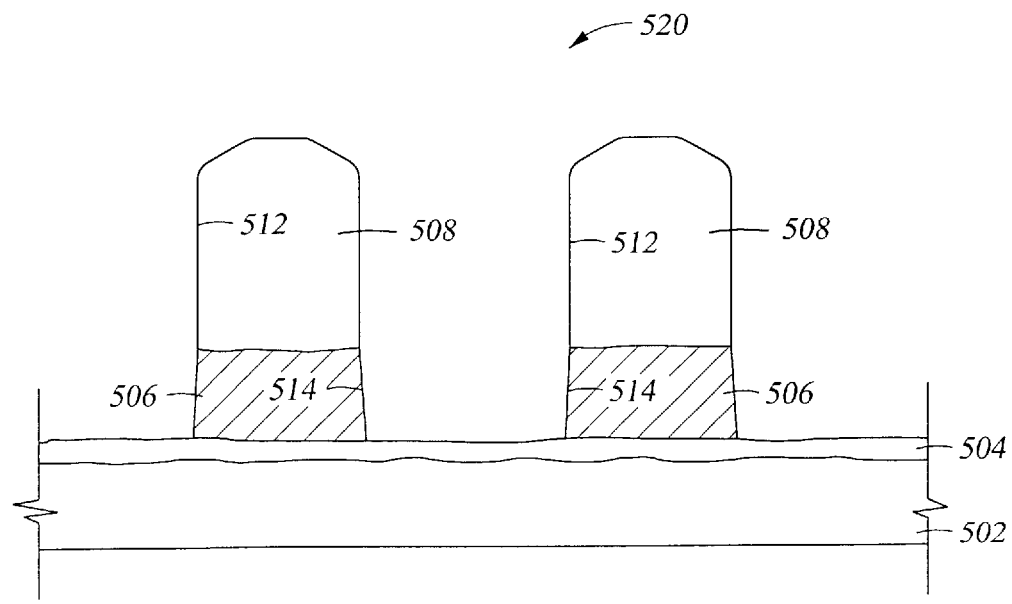
FIG. 5B shows an etched stack of layers (520) produced without a substrate preheating step. The layer stack was the same as that of FIG. 5A, and the etchant used during plasma etching of the platinum-containing layer was the same as the etchant used to etch the layer stack shown in FIG. 5A. No residual material was observed on the exterior surfaces of patterned silicon oxide hard mask layer (508) sidewall (512), nor on the exterior surfaces of etched platinum-containing layer (506) sidewall (514).

FIG. 5B is representative of the comparative example in which the etch stack described with reference to FIG. 5A is preheated using an electrostatic chuck having a resistive heater embedded therein. There was no plasma preheating of the substrate. The platinum-containing layer 506 was etched using the $Cl_2/N_2/Ar$ plasma source described in Table Two. The process conditions were as described previously, above. No residue was present after etching of the platinum-containing layer 506. This clearly illustrates that the residue material 510 observed with reference to FIG. 5A was produced as a result of the sputtering/etching of substrate etch stack material which occurred during the plasma preheating of the substrate using a plasma generated from the $Cl_2/N_2/Ar$ plasma source gas.

Similar studies were made on a more limited basis for other etch stacks containing metals or metal-containing compounds which are of low volatility, similar to platinum. In particular, substrates containing etch stacks including either iridium or ruthenium dioxide were preheated and etched in a manner similar to that described above. Either nitrogen or oxygen was used to generate the plasma used to preheat the substrate. The etchant plasma used to etch iridium was generated from a plasma source gas containing $O_2/Cl_2/CF_4$. The etchant plasma used to etch ruthenium dioxide was generated from a plasma source gas containing $O_2/Cl_2/Ar$. Although applicants were able to obtain etched iridium profiles which appeared to be relatively free from sputtered metal-containing material, the overall etch results in terms of etch rate, selectivity, and etch profile were less than desired. Work to develop a satisfactory etchant plasma for etching iridium will have to be done prior to determining the best plasma source gas for preheating of the substrates.

The etching of a ruthenium dioxide-comprising etch stack provided more encouraging results, which are presented below.

TABLE THREE

| Ruthenium Dioxide-Containing Substrate Layer-Etch Profile | | |
|---|---|---|
| Run # | 1 | 2 |
| $N_2$ Preheat Gas (sccm) | 100 | — |
| $O_2$ Preheat Gas (sccm) | — | 100 |
| Etch Profile | Virtually Vertical | Virtually Vertical |

Each substrate was preheated for about 45 seconds. Other preheating parameters included a chamber pressure of about 20 mTorr; a substrate bias power of about 500 W; a plasma source power of about 1800 W; and a cathode temperature of about 80° C.

Each ruthenium dioxide layer was plasma etched for about 60 seconds and thereafter exposed to a diluted HF solution. The etchant plasma was generated from a plasma source gas comprising 320 sccm of $O_2$, 80 sccm of $Cl_2$, and 20 sccm of Ar. Other process parameters included an etch chamber pressure of about 36 mTorr; a substrate bias power of about 200 W; a plasma source power of about 1500 W; and a cathode temperature of about 80° C.

In Runs #1 and #2, both plasma gases that were used to preheat the substrate ($O_2$ and $N_2$) produced similarly good results after the plasma etch and HF solution exposure. Virtually all of the sputtered material was removed during the plasma etch step, thereby producing a residue-free, essentially vertical etch profile.

The above described preferred embodiments are not intended to limit the scope of the present invention, as one skilled in the art can, in view of the present disclosure expand such embodiments to correspond with the subject matter of the invention claimed below.

We claim:

1. A method of preheating a substrate when a material on said substrate surface is to be pattern etched at a temperature in excess of 150° C., wherein said method comprises exposing said substrate surface to a preheating plasma generated from a plasma source gas which includes a reactive gas that is selected so that sputtered/etched residue produced during said preheating is more easily etched during a subsequent pattern etching step than said material which is being pattern etched, and wherein said subsequent pattern etching step is carried out using a different plasma source gas than said plasma source gas used during said preheating.

2. The method of claim 1, wherein said material which is to be pattern etched is a metal or a metal-comprising compound.

3. The method of claim 2, wherein said metal is selected from the group consisting of platinum, iridium, ruthenium, or combinations thereof.

4. The method of claim 2, wherein said metal in said metal-comprising compound is selected from the group consisting of platinum, iridium, ruthenium, or combinations thereof.

5. The method of claim 1, wherein said reactive gas present in said preheating plasma source gas is also present in said different plasma source gas which is used to generate a plasma for pattern etching of said material to be pattern etched.

6. The method of claim 5, wherein said material to be pattern etched comprises a metal selected from the group consisting of platinum, iridium, ruthenium, or combinations thereof.

7. The method of claim 6, wherein said metal is platinum and said reactive gas is nitrogen.

8. The method of claim 6, wherein said metal is ruthenium and said reactive gas is selected from the group consisting of oxygen, nitrogen, and combinations thereof.

9. The method of claim 1, wherein said preheating plasma reacts slightly with said material which is to be subsequently pattern etched, and wherein said slight reaction produces an etch rate ranging between about 200 Å/mm. and about 800 Å/mm.

10. The method of claim 9, wherein said preheating plasma reacts slightly with said material which is to be subsequently pattern etched, and wherein said slight reaction produces an etch rate ranging between about 250 Å/mm. and 600 Å/mm.

11. A method of preheating a substrate which includes a material on said substrate surface which is to be pattern etched at a temperature in excess of 150° C., said method including the use of a reactive gas in a plasma source gas used to generate a preheating plasma which is slightly reactive with the material which is to be pattern etched subsequently using a plasma source gas having an overall composition different from said preheating plasma source gas.

12. The method of claim 11, wherein said material which is to be pattern etched is a metal or a metal-comprising compound.

13. The method of claim 12, wherein said metal is selected from the group consisting of platinum, iridium, ruthenium, or combinations thereof.

14. The method of claim 12, wherein said metal in said metal-comprising compound is selected from the group consisting of platinum, iridium, ruthenium, or combinations thereof.

15. The method of claim 11, wherein said reactive gas is also present in a plasma source gas used to generate a plasma for pattern etching said material which is to be pattern etched.

16. The method of claim 15, wherein said material which is to be pattern etched comprises a metal selected from the group consisting of platinum, iridium, ruthenium, or combinations thereof.

17. The method of claim 16, wherein said metal is platinum and said reactive gas is nitrogen.

18. The method of claim 16, wherein said metal is ruthenium and said reactive gas is selected from the group consisting of oxygen, nitrogen, and combinations thereof.

19. The method of claim 11, wherein said preheating plasma is capable of etching the material which is to be pattern etched at an etch rate ranging between about 200 Å/mm. and about 800 Å/mm.

20. The method of claim 19, wherein said preheating plasma is capable of etching the material which is to be pattern etched at an etch rate ranging between about 250 Å/min. and 600 Å/min.

21. A method of plasma heating a substrate and etching a metal-containing layer present of a surface of said substrate while maintaining control over a critical dimension of a feature etched in said metal-containing layer, said method comprising the steps of:

a) supplying a first plasma source gas to a process chamber containing said substrate, wherein said first plasma source gas is used to generate a plasma used to preheat said substrate, and wherein said plasma source gas contains at least one gas which is slightly reactive with said metal-containing layer;

b) preheating said substrate to a temperature of at least 150° C. using ion bombardment from said first plasma;

c) supplying a second plasma source gas different from said first plasma source gas, which second plasma source gas is used to generate a plasma to etch said metal-containing layer; and d) etching said metal-containing layer, wherein essentially all of a residue generated during said preheating of said substrate is removed during said etching of said metal-containing layer.

22. The method of claim 21, wherein at least one reactive gas present in said first plasma source gas is also present in said second plasma source gas.

23. The method of claim 21 or claim 22, wherein said metal-containing layer contains a metal selected from the group consisting of platinum iridium, ruthenium, or combinations thereof.

24. The method of claim 23, wherein said metal is platinum and said reactive gas is nitrogen.

25. The method of claim 23, wherein said metal is ruthenium and said reactive gas is selected from the group consisting of oxygen, nitrogen, and combinations thereof.

* * * * *